US006851152B2

(12) United States Patent
Sotozaki et al.

(10) Patent No.: US 6,851,152 B2
(45) Date of Patent: Feb. 8, 2005

(54) SUBSTRATE CLEANING APPARATUS (75) Inventors: Hiroshi Sotozaki, Kanagawa (JP); Fumitoshi Oikawa, Kanagawa (JP)

(73) Assignee: Ebara Corporation, Tokyo (JP)

( * ) Notice: Subject to any disclaimer, the term of this patent is extended or adjusted under 35 U.S.C. 154(b) by 439 days.

(21) Appl. No.: 09/924,464

(22) Filed: Aug. 9, 2001

(65) Prior Publication Data

US 2002/0022445 A1 Feb. 21, 2002

(30) Foreign Application Priority Data

Aug. 9, 2000 (JP) ........................................ 2000/241794

(51) Int. Cl.$^7$ ............................................ A47L 25/00
(52) U.S. Cl. ................ 15/88.3; 15/77; 15/102
(58) Field of Search .................... 15/77, 88.3, 179, 15/211, 88.2, 88.4, 102

(56) References Cited

U.S. PATENT DOCUMENTS

| | | | | |
|---|---|---|---|---|
| 5,485,644 A | * | 1/1996 | Shinbara et al. | ............. 15/21.1 |
| 5,725,414 A | | 3/1998 | Moinpour et al. | |
| 5,937,469 A | | 8/1999 | Culkins et al. | |
| 5,966,765 A | | 10/1999 | Hamada et al. | |
| 6,012,192 A | * | 1/2000 | Sawada et al. | ................ 15/77 |
| 6,041,465 A | * | 3/2000 | Yashiki et al. | ............... 15/88.3 |
| 6,082,377 A | * | 7/2000 | Frey | ............................... 134/6 |
| 6,119,295 A | * | 9/2000 | Gockel et al. | .................. 15/77 |
| 6,202,658 B1 | | 3/2001 | Fishkin et al. | |
| 6,230,753 B1 | | 5/2001 | Jones et al. | |
| 6,334,229 B1 | * | 1/2002 | Moinpour et al. | ............. 15/77 |
| 6,427,566 B1 | * | 8/2002 | Jones et al. | .................... 82/101 |
| 6,439,245 B1 | * | 8/2002 | Bliven et al. | .................. 134/32 |
| 6,594,847 B1 | * | 7/2003 | Krusell et al. | .................. 15/77 |
| 6,622,334 B1 | * | 9/2003 | Ziemins et al. | ................. 15/77 |

FOREIGN PATENT DOCUMENTS

JP                105376          4/1989

OTHER PUBLICATIONS

Pending U.S. Appl. No. 09/635,848 Hiroshi Tomita et al. filed Aug. 11, 2000.

* cited by examiner

Primary Examiner—Terrence R. Till
Assistant Examiner—S Balsis
(74) Attorney, Agent, or Firm—Wenderoth, Lind & Ponack, L.L.P.

(57) ABSTRACT

A substrate cleaning apparatus allows an end face and/or a bevel face of a substrate to be scrub-cleaned in a simple and effective manner. The apparatus has a plurality of rotatable substrate rotating rollers for gripping a periphery of the substrate and rotating the substrate, a cleaning roller capable of rotating and having a cleaning member which is to be brought into contact with the end face and/or the bevel face of the substrate so as to apply scrub-cleaning to the end face and/or the bevel face, and a power transmission mechanism for transmitting a rotating force of the substrate rotating roller to the cleaning roller so as to rotate the cleaning roller.

16 Claims, 9 Drawing Sheets

SUBSTRATE CLEANING APPARATUS

BACKGROUND OF THE INVENTION

The present invention relates to substrate cleaning apparatus, and in particular, to substrate cleaning apparatus which allows a simple and effective scrubbing-away of particles adhering to an end face and/or a bevel face of a substrate, such as a semiconductor substrate, a glass substrate or a liquid crystal panel which requires a high degree of cleanliness.

In recent years, as semiconductor devices have been more densely packed, wiring in circuits on semiconductor substrates have been more highly-integrated and the distance between wires has been reduced. Especially in optical lithography with a distance between wires not greater than 0.5 $\mu$m, a high degree of flatness is required on the image forming plane of a stepper due to a shallow focal depth. Further, if there is a particle of a diameter greater than the distance between the wires on the substrate, it may cause a problem such as a shorting between the wires or the like, and therefore, it is important in substrate processing to achieve cleanliness as well as planarization. Such circumstances may be common to a process for processing glass substrates used for masks and the like or substrates used for liquid-crystal panels and the like. These requirements have given rise to the need for a cleaning technique to remove sub-micron particles from the semiconductor substrate or the like.

For example, as a method for achieving a high degree of cleanliness for a polished semiconductor substrate, a variety of methods have been suggested including scrub cleaning, in which a cleaning body composed of brush, sponge or the like is rubbed on the substrate; and a cavitation-jet cleaning in which a high pressure liquid (a high speed jet flow) is injected toward the substrate to generate air-bubbles by cavitation in order to clean the substrate.

However, there is a problem associated with the above-described prior art in that, although a surface of a substrate can be cleaned to a high degree of cleanliness, the end face and/or the bevel face of the substrate cannot be cleaned efficiently, and as a result, those particles that have not been removed and remain on the end face and/or the bevel face of the substrate would be stuck on the surface of the substrate.

SUMMARY OF THE INVENTION

In the light of the above-described circumstances, an object of the present invention is to provide substrate cleaning apparatus which allows the end face and/or the bevel face of a substrate to be scrub-cleaned in a simple and also effective manner.

A first aspect of the invention provides a substrate cleaning apparatus comprising: a plurality of substrate rotating rollers for gripping the periphery of a substrate and rotating the substrate; a cleaning roller capable of rotating and having a cleaning member which is to be brought into contact with the end face and/or the bevel face of the substrate so as to apply scrub-cleaning to the end face and/or the bevel face; and a power transmission mechanism for transmitting a rotating force of at least one roller of the substrate rotating rollers to the cleaning roller so as to rotate the cleaning roller.

This allows the cleaning roller to be rotated in association with the revolution of the substrate rotating roller for rotating the substrate in order to clean the end face and/or the bevel face of the substrate, without any separate driving power source provided exclusively for the cleaning roller. Further, since the function for cleaning the end face and/or the bevel face of the substrate is designed to be performed independently, this function can be easily added to a cleaning apparatus of roller-sponge type or the like which has been commonly used, and also this function would not be an obstacle when cleaning the substrate by rotating it at a high speed.

A second aspect of the invention provides a substrate cleaning apparatus according to the first aspect, in which the power transmission mechanism has its revolution transfer ratio set such that there would be a relative difference in velocity between the peripheral velocity of revolution of the cleaning member and the peripheral velocity of revolution of the substrate. In this way, generating the relative difference in velocity between the peripheral velocity of revolution of the cleaning member and the peripheral velocity of revolution of the substrate allows particles to be scrubbed from the end-face and/or the bevel face of the substrate in an effective manner.

A third aspect of the invention provides a substrate cleaning apparatus according to either of the first or the second aspects, in which the apparatus further comprises a cleaning nozzle for injecting a cleaning liquid against the surface of the cleaning member to be brought into contact with the substrate. By means of this configuration, a cleaning liquid, such as ultrapure water or chemicals, which is suitable for removing particles, can be supplied from the cleaning nozzle to the cleaning member and the end face and/or the bevel face of the substrate.

A fourth aspect of the invention provides a substrate cleaning apparatus in accordance with any of the first to the third aspects, in which the apparatus further comprises a force adjusting mechanism for adjusting the force of the cleaning member against the end face and/or the bevel face of the substrate. This may allow the cleaning roller to be easily adjusted to an arbitrary position to optimize the force from the standpoint of cleaning ability and abrasion of the cleaning member.

A fifth aspect of the invention provides a substrate cleaning apparatus in accordance with any of the first to the third aspects, in which the cleaning roller is rotatably supported on the free end of a swingable swing arm, wherein the swing arm is biased in the direction of bringing the cleaning member into contact with the end face and/or the bevel face of the substrate. This may also allow the end face and/or the bevel face of a flat oriented portion of a substrate having the flat oriented portion to be cleaned by applying to the swing arm an appropriate bias force corresponding to the speed of revolution of the substrate.

A sixth aspect of the invention provides a substrate cleaning apparatus according to any of the first to the fifth aspects, in which the apparatus further comprises a contact-location adjusting mechanism for adjusting the contact-location of the cleaning member with the substrate in the vertical direction of the cleaning member. This may allow the cleaning member to be efficiently utilized over the full width in the vertical direction thereof by shifting the cleaning member in the height direction by an appropriate distance according to the amount of abrasion, thus using the cleaning member in an economical manner.

BRIEF DESCRIPTION OF THE DRAWINGS

FIGS. 6(a) and (b) are partial plan views of the substrate cleaning apparatus, wherein each of FIG. 6(a) and FIG. 6(b) illustrates different conditions where the amount of pushing force of a cleaning member against the substrate has been adjusted differently via a force adjusting mechanism;

FIGS. 10(a) and (b) are cross sectional views illustrating the contact location adjusting mechanism of a cleaning member, wherein each of FIG. 10(a) and FIG. 10(b) shows a different embodiment thereof;

DETAILED DESCRIPTION OF THE PREFERRED EMBODIMENTS

Preferred embodiments of the present invention will now be described with reference to the attached drawings.

FIGS. 1 to 6(b) show a substrate cleaning apparatus 1 of a first embodiment according to the present invention, wherein this substrate cleaning apparatus comprises a pair of support bases 10, 10 respectively positioned in a front or a rear (or in a left or a right) side so as to be capable of moving horizontally to come close to or to go away from each other. Each of the support bases 10, 10 operatively supports a pair of revolving rollers 12 and 14 so as to rotate freely, each of the revolving rollers 12 and 14 being disposed in a location to circumscribe the periphery of a wafer W. Further, each of the support bases 10, 10 is equipped with a substrate rotating mechanism 16 for rotating the pair of substrate rotating rollers 12 and 14 arranged thereon synchronously with each other in the same direction thus to rotate the substrate W.

This substrate rotating mechanism 16 (FIG. 2) has a servo-motor 18, and a first timing belt 26 extends between so as to couple a first drive pulley 20 fixedly attached to the output shaft of the servo-motor 18 and a first driven pulley 24 fixedly attached to the lower end of a rotary shaft 22 of one substrate rotating roller 12. Further, a second timing belt 34 extends between so as to couple a second drive pulley 28 fixedly attached to an intermediate location along the longitudinal direction of the rotary shaft 22 of the one substrate rotating roller 12 and a second driven pulley 32 fixedly attached to the lower end of a rotary shaft 30 of the other substrate rotating roller 14. To this second timing belt 34, a tension pulley 36 is applied for regulating the tensile force of the second timing belt 34.

In the mechanism, the one substrate rotating roller 12 is coupled with the upper end of the rotary shaft 22 supported by bearings 38 and 40 (see FIG. 3) so as to rotate freely, while the other substrate rotating roller 14 is coupled, into one body, with the upper end of the rotary shaft 30 supported by the bearing 40 (see FIG. 3) so as to rotate freely.

Figure 2:
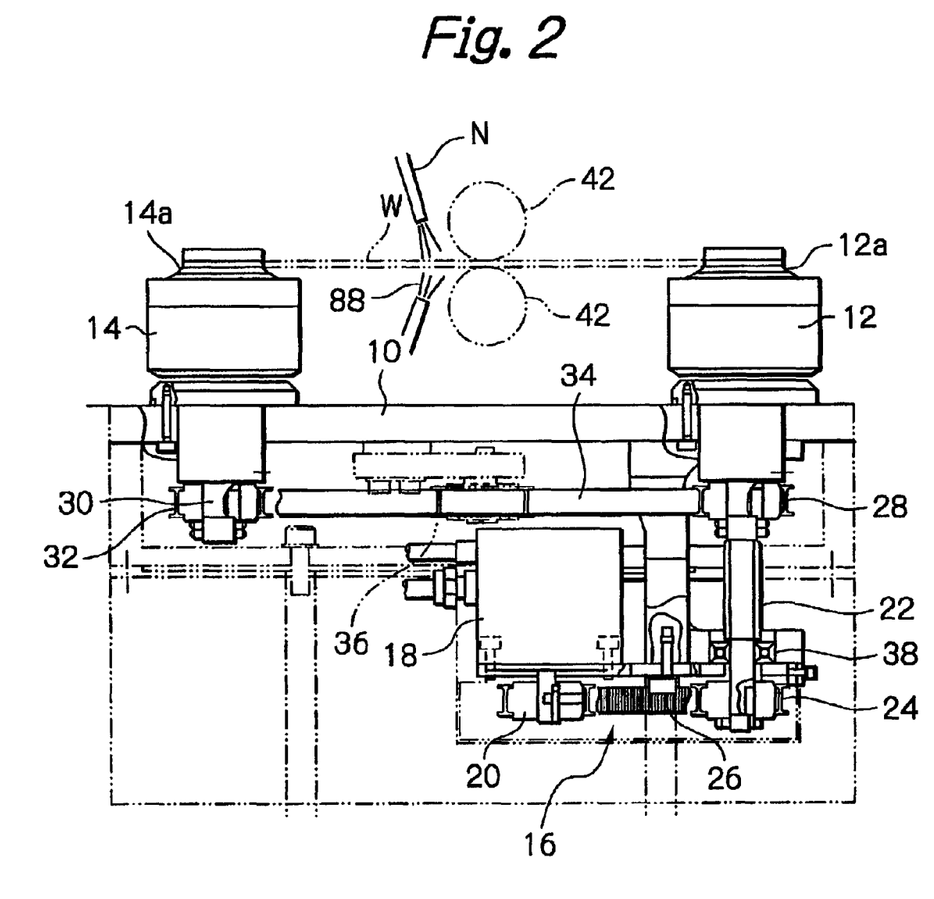
FIG. 2 is a cross sectional view taken along the line A—A of FIG. 1.

In this configuration, when the servo-motor 18 starts to drive, the one substrate rotating roller 12 is rotated together with the rotary shaft 22 via the first timing belt 26 and thus, in association with the revolution of the rotary shaft 22, the other substrate rotating roller 14 is rotated together with the rotary shaft 30 to be synchronized with the one substrate rotating roller 12 in the same direction via the second timing belt 34.

Figure 1:
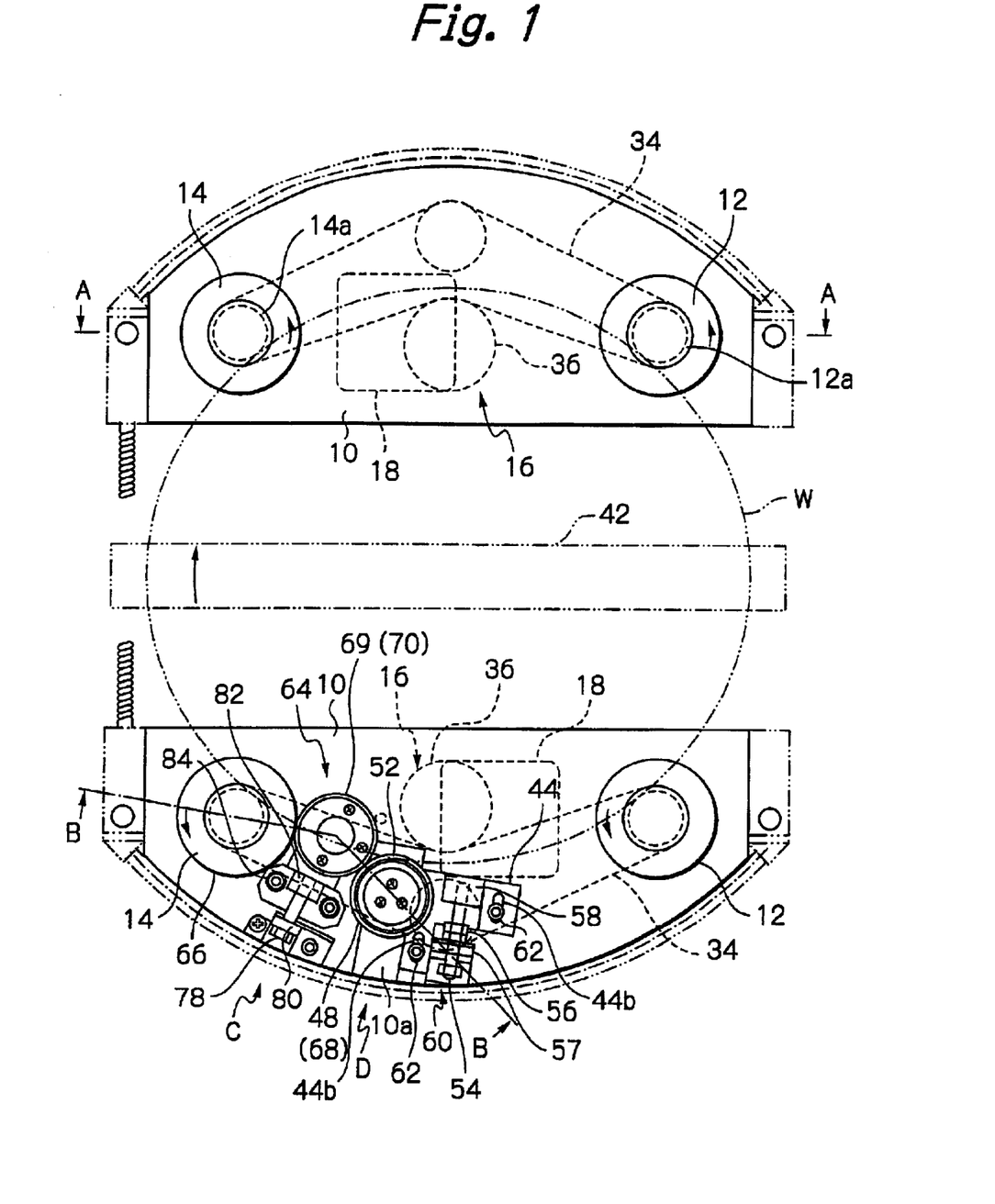
FIG. 1 is a plan view illustrating a substrate cleaning apparatus of the first embodiment according to the present invention.

On respective top portions of the substrate rotating rollers 12 and 14, there are formed gripping grooves 12a and 14a for gripping the substrate W, into which the periphery of the substrate W is to be inserted, wherein, the substrate W is placed in a predetermined position surrounded by the substrate rotating rollers 12 and 14; the periphery of the substrate W is gripped in the gripping grooves 12a and 14a by moving each of the pair of support bases 10, 10 in respective directions to bring them closer to each other; and in this condition, by rotating the substrate rotating rollers 12 and 14 in the same direction in synchrony with each other, the substrate is rotated; while the substrate W is released from the gripped state by moving each of the pair of support bases 10, 10 in respective directions to bring them apart from each other.

Further, a pair of cleaning members 42 for scrub-cleaning are operatively arranged above and beneath the substrate W having been gripped by the substrate rotating rollers 12 and 14, so as to move upward and downward, and to rotate freely. Each of the cleaning members is composed of, for example, an elongated cylindrical roll sponge or the like extending along the full length along the diameter of the substrate W. A cleaning liquid is supplied to the vicinities of the cleaning members 42, 42 by nozzles "N" from upper and lower sides, respectively. Thereby, under a condition where the substrate W is rotated at a rotating speed of, for example, 100 r.p.m. in a manner described above, the substrate W can be scrub-cleaned over all areas of the top and the bottom surfaces thereof by bringing the cleaning members 42, 42 into contact with respective surfaces of the substrate while rotating the cleaning members 42, 42 on their respective axes.

The substrate cleaning apparatus according to this embodiment is further provided with a mechanism described below to apply a scrub-cleaning to the end face and/or the bevel face of the substrate W in addition to the function of applying the scrub-cleaning to the top and the bottom surfaces of the substrate as described above.

Figure 3:
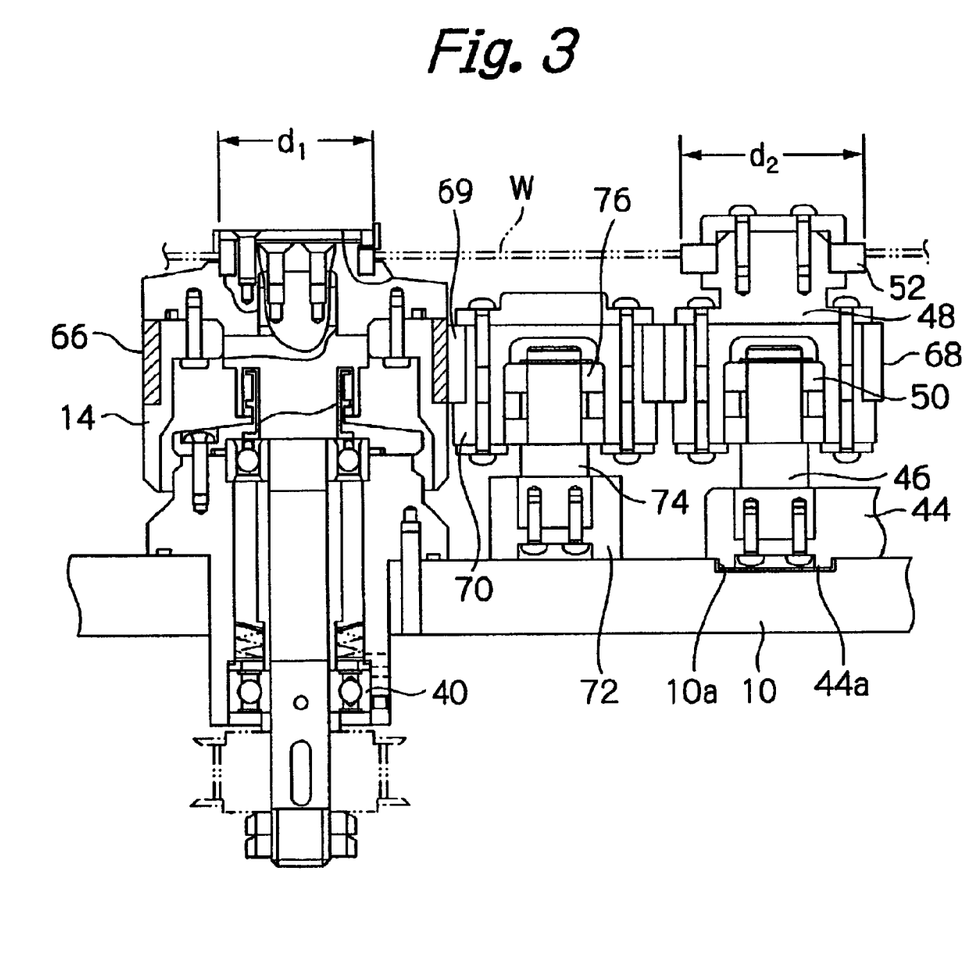
FIG. 3 is a cross sectional view taken along the line B—B of FIG. 1.
Figure 4:
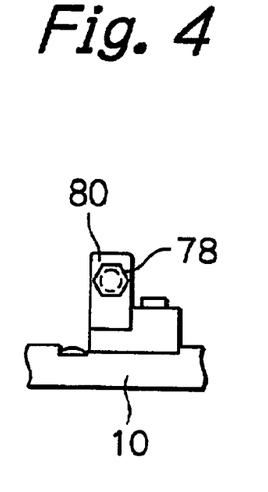
FIG. 4 is a fragmentary view taken in the direction designated by the arrow C of FIG. 1.
Figure 5:
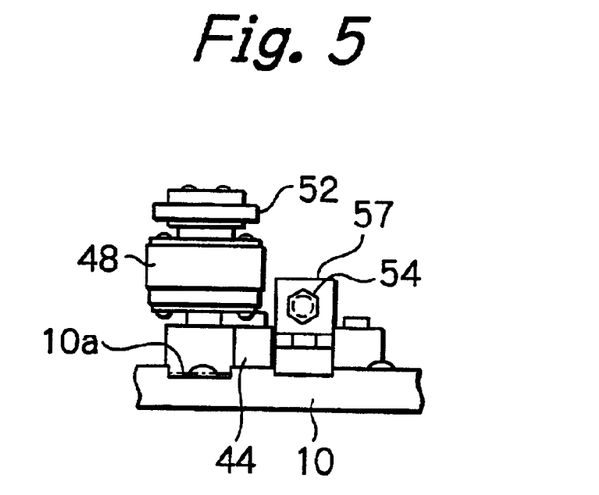
FIG. 5 is a fragmentary view taken in the direction designated by the arrow D of FIG. 1.
Figure 6:
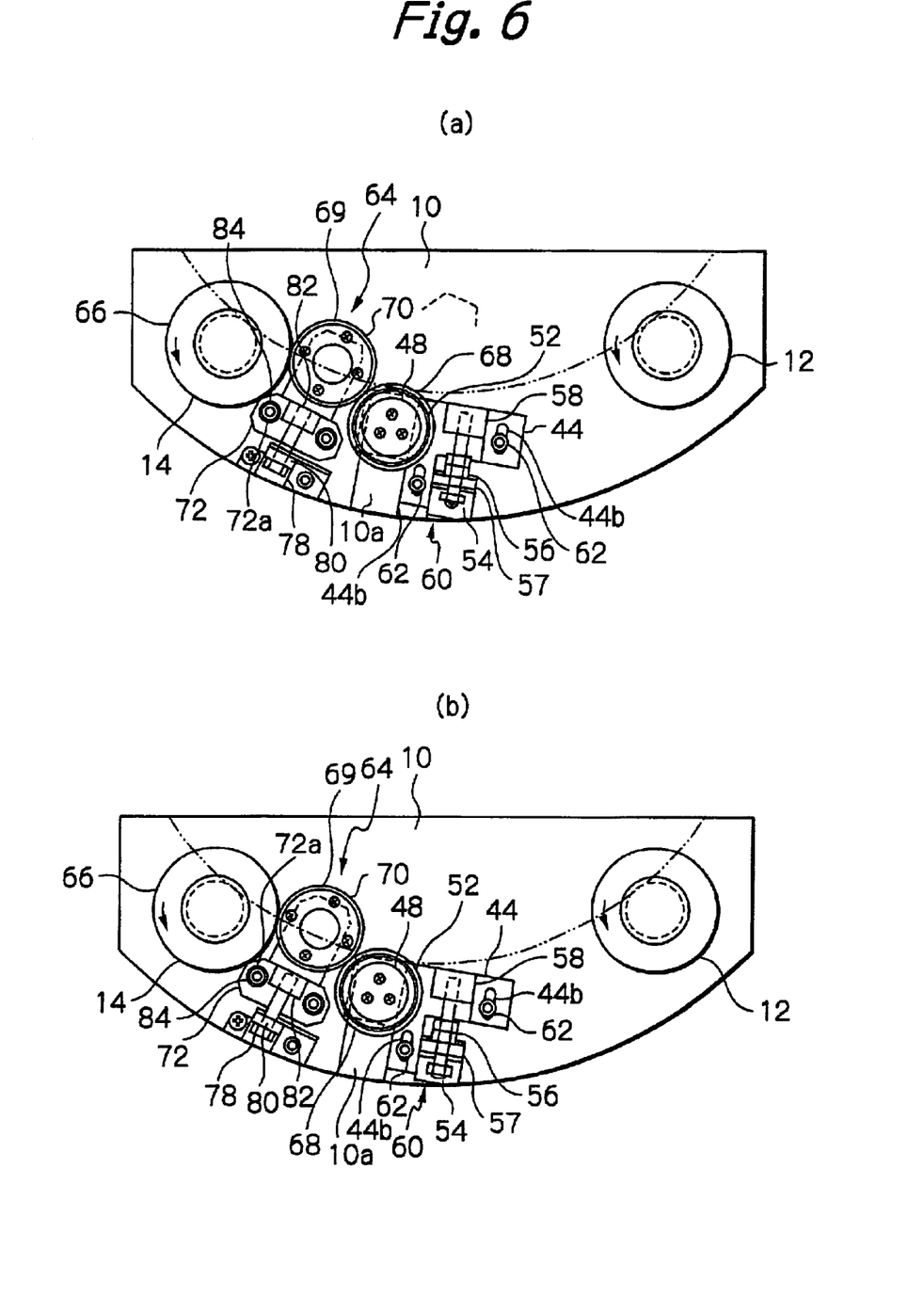

That is, as shown in FIG. 3, a cleaning roller transfer base 44 is arranged on one of the support bases 10, and a cleaning roller 48 is rotatably supported via a bearing 50 on a support rod 46 vertically mounted on the transfer base 44. Further, a ring cleaning member 52 made of, for example, sponge or the like is fixedly attached to the cleaning roller 48 at a location in the upper portion thereof, with which location the end face and/or the bevel face of the substrate W is brought into contact when the substrate W is gripped by the substrate rotating rollers 12 and 14. The cleaning member 52 is to be brought into contact with the end face and/or the bevel face of the substrate W so as to perform the scrub-cleaning to remove the particles sticking thereto.

The support base 10 is provided with a guiding slot 10a extending along the diametrical direction of the substrate, and a convex portion 44a to mate with this guiding slot 10a is arranged in the bottom face of the cleaning roller transfer base 44. Further, next to the cleaning roller transfer base 44 a bracket 57 is vertically mounted with a nut 56 attached thereto so as to be engaged by threads with a force adjusting bolt 54 extending in parallel with the guiding slot 10a, and a pushing piece 58 is vertically mounted on the cleaning roller transfer base 44. The pushing piece 58 includes a female thread portion to be engaged with the tip portion of the force adjusting bolt 54. Herein, the force adjusting bolt 54 is adapted to be engaged with the nut 56 and the female thread portion arranged in the pushing piece 58 in varying pitches, thereby making up a force adjusting mechanism for adjusting the force of the cleaning member 52 against the substrate W.

In this example, as the force adjusting bolt 54 is rotated in the fastening direction from the condition illustrated in FIG. 3 (where the overlap of the cleaning member 52 with the substrate W is 1 mm), the cleaning roller transfer base 44 is guided by the guiding slot 10a and the convex portion 44a to be moved away from the substrate W due to the difference in pitch between the nut 56 and the female thread portion arranged in the pushing piece 58, resulting in the condition as shown in FIG. 6(a) (where the overlap of the cleaning member 52 with the substrate W is 0 mm). While in contrast, as the force adjusting bolt 54 is rotated in the unfastening direction, the cleaning roller transfer base 44 is guided by the guiding slot 10a and the convex portion 44a to be moved closer to the substrate W due to the difference in pitch between the nut 56 and the female thread portion arranged in the pushing piece 58, resulting in the condition shown in FIG. 6(b) (where the overlap of the cleaning member 52 with the substrate W is 3 mm).

Herein, the cleaning roller transfer base 44 is mounted to the support base 10 by two check bolts 62, and an elongated hole 44b extending in parallel with the guiding slot 10a is formed in the cleaning roller transfer base 44 at each location through which each of the check bolts 62 penetrates. Thereby, upon adjusting the position of the cleaning roller transfer base 44 by rotating the force adjusting bolt 54 as described above, the check bolts 62 should have been first unfastened and then should be fastened after the completion of the adjustment, so that this operation would not be obstructed and that the cleaning roller transfer base 44 is fixed onto the support base 10.

The cleaning roller 48 is adapted to rotate via a power transmitting mechanism 64 in association with the revolution of the substrate rotating roller 14. That is, in this example, an outer peripheral face of the substrate rotating roller 14 is fittingly attached with a driving frictional ring 66 made of material with a high friction coefficient, such as urethane or the like, and also an outer peripheral face of the cleaning roller 48 at a height corresponding to the driving frictional ring 66 is fittingly attached with a driven frictional ring 68 made of material with a high friction coefficient, such as urethane or the like. In addition, an intermediate roller 70 is rotatably supported and disposed between the substrate rotating roller 14 and the cleaning roller 48, and an intermediate frictional ring 69 made of material with a high friction coefficient, such as urethane or the like, is attached onto the outer peripheral face of the intermediate roller 70 at a location in the height corresponding to the driving frictional ring 66 so as to be brought into compressive contact with both of the driving frictional ring 66 and the driven frictional ring 68. These components make up a power transmission mechanism 64 taking advantage of the friction force between the components, in which the cleaning roller 48 is driven to rotate in the same direction as the substrate rotating roller 14 via the intermediate roller 70 when the substrate rotating roller 14 rotates.

Herein, a diameter d1 of the gripping groove 14a of the substrate rotating roller 14 and a diameter d2 of the cleaning member 52 are determined such that the ratio between them should be a value other than 1 (d1/d2≠1) in order to generate a relative velocity difference between a peripheral velocity of revolution of the cleaning member 52 and the peripheral velocity of revolution of the substrate W. In this way, providing the relative velocity difference between the peripheral velocity of revolution of the cleaning member 52 and the peripheral velocity of revolution of the substrate W allows the end face and/or the bevel face of the substrate W to be scrub-cleaned effectively by the cleaning member 52 so as to remove particles sticking thereon.

Further, the intermediate roller 70 is rotatably supported via a bearing 76 on a support rod 74 vertically mounted on an intermediate roller transfer base 72. Further, a bracket 80, through which a position adjusting bolt 78 is to be penetrated, is vertically mounted at a location external to the intermediate roller transfer base 72, while a pushing piece 82 with a female thread formed therein to be engaged through thread with the position adjusting bolt 78 is vertically mounted on the intermediate roller transfer base 72. By means of this configuration, the intermediate roller transfer base 72 may be moved outwardly as the position adjusting bolt 78 is rotated in the fastening direction. While in contrast, the intermediate roller transfer base 72 may be moved inwardly as the position adjusting bolt 78 is rotated in the unfastening direction, so that the pushing force (friction force) of the intermediate frictional ring 69 against the driving frictional ring 66 and the driven frictional ring 68 can be adjusted.

Thus, even when the force of the cleaning member 52 against the substrate W is adjusted via the force adjusting mechanism 60 as described above, the friction force of the intermediate frictional ring 69 against the driving frictional ring 66 and the driven frictional ring 68 can be prevented from falling into any excess or deficiency by adjusting the pushing force of the intermediate frictional ring 69 against the driving frictional ring 66 and the driven frictional ring 68.

Herein, the intermediate roller transfer base 72 is mounted to the support base 10 with two check bolts 84, and an elongated hole 72a extending in parallel with the position adjusting bolt 78 is formed in the intermediate roller transfer base 72 at each location through which each of the check bolts 84 is to be penetrated. Thereby, upon adjusting the position of the intermediate roller transfer base 72 by rotating the position adjusting bolt 78 as described above, the check bolts 84 should have been first unfastened and then should be fastened after the completion of the adjustment, so that this operation would not be obstructed and that the intermediate roller transfer base 72 is fixed onto the support base 10.

In accordance with the substrate cleaning apparatus having a configuration described above, the end face and/or the bevel face of the substrate can be scrub-cleaned effectively by the cleaning member 52 in such a manner that primarily, a pair of support bases 10, 10 are moved closer to each other so as to grip the peripheral portion of the substrate W by the gripping grooves 12a and 14a; then, in this condition, when the substrate rotating roller 12 and 14 are rotated in the same direction in synchrony with each other to rotate the substrate W, the cleaning roller 48 is rotated via the power transmission mechanism 64; and thereby the relative velocity difference generated between the peripheral velocity of revolution of the cleaning member 52 and the peripheral velocity of revolution of the substrate W helps the end face and/or the bevel face of the substrate W be scrub-cleaned by the cleaning member in contact with those faces in an effective manner. By, under this condition, bringing the cleaning members 42 into contact with the substrate W while rotating the cleaning members 42 on their respective axes, the scrub-cleaning may be performed covering entire areas on the top and the bottom surfaces of the substrate W, which allows the end face and/or the bevel face to be scrub-cleaned simply and effectively.

Then, the cleaning operation having been finished, the rotation of the substrate rotating rollers 12 and 14 is stopped so as to stop the revolution of the substrate W, and each of the pair of support bases 10, 10 is moved away from the other to release the substrate W from its gripped condition, where stopping of the rotation of the substrate rotating rollers 12 and 14 results in automatic stopping of the rotation of the cleaning roller 48.

Figure 7:
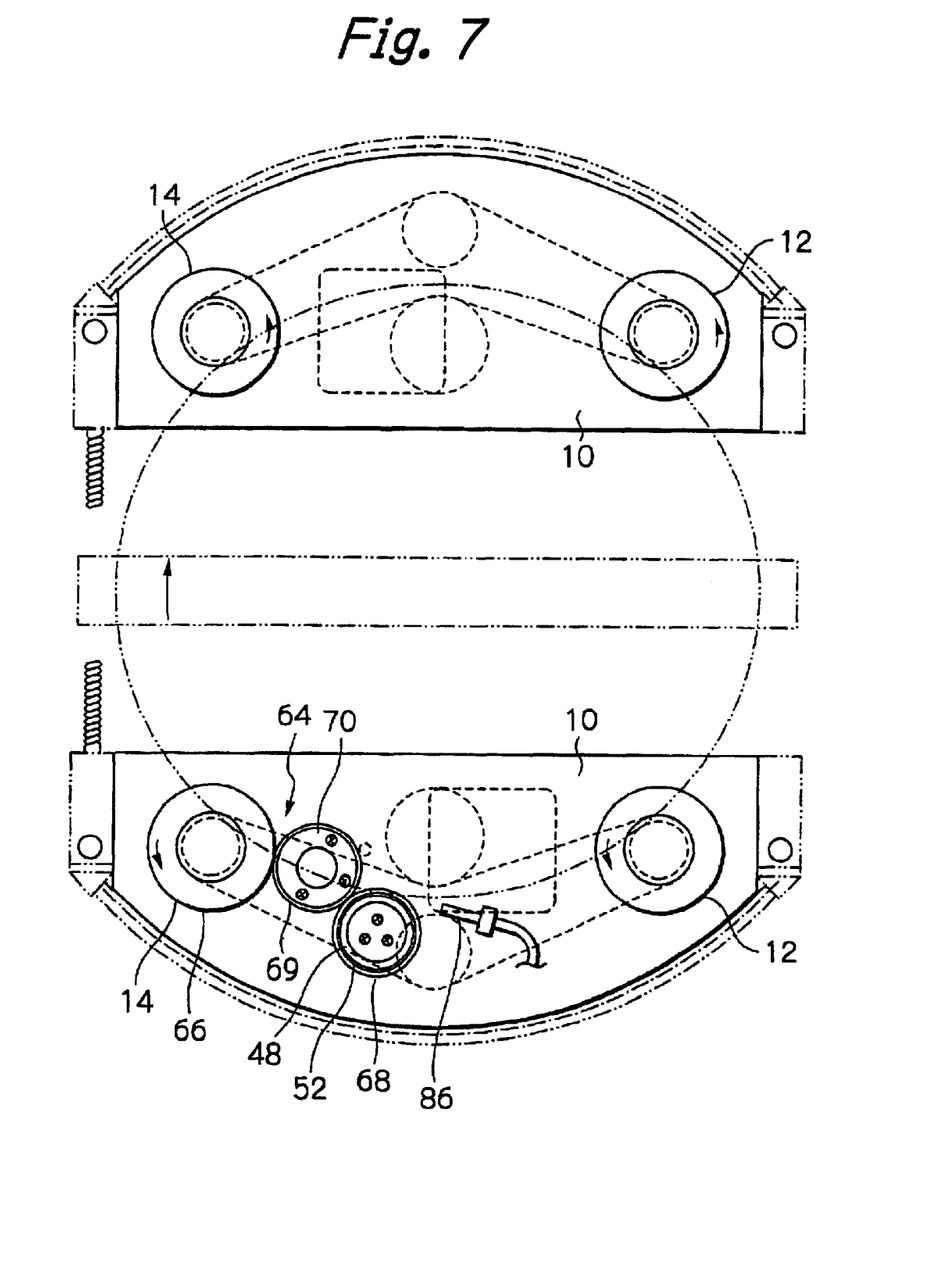
FIG. 7 is a plan view illustrating a substrate cleaning apparatus of the second embodiment according to the present invention.

FIG. 7 shows a substrate cleaning apparatus according to the second embodiment of the present invention, in which a cleaning nozzle 86 is arranged next to a cleaning roller 48 for injecting a cleaning liquid toward the face of the cleaning member 52 to be brought into contact with the substrate W. The rest of the configuration of the second embodiment is the same with that of the first embodiment. According to this embodiment, supplying cleaning liquid, such as ultrapure water or chemicals, from the nozzle 86 between the cleaning member 52 and the end face and/or the bevel face of the substrate W may effectively remove particles sticking thereon. It is to be noted that the pure water having ultrasonic waves applied thereto may be supplied from the cleaning nozzle 86.

Figure 8:
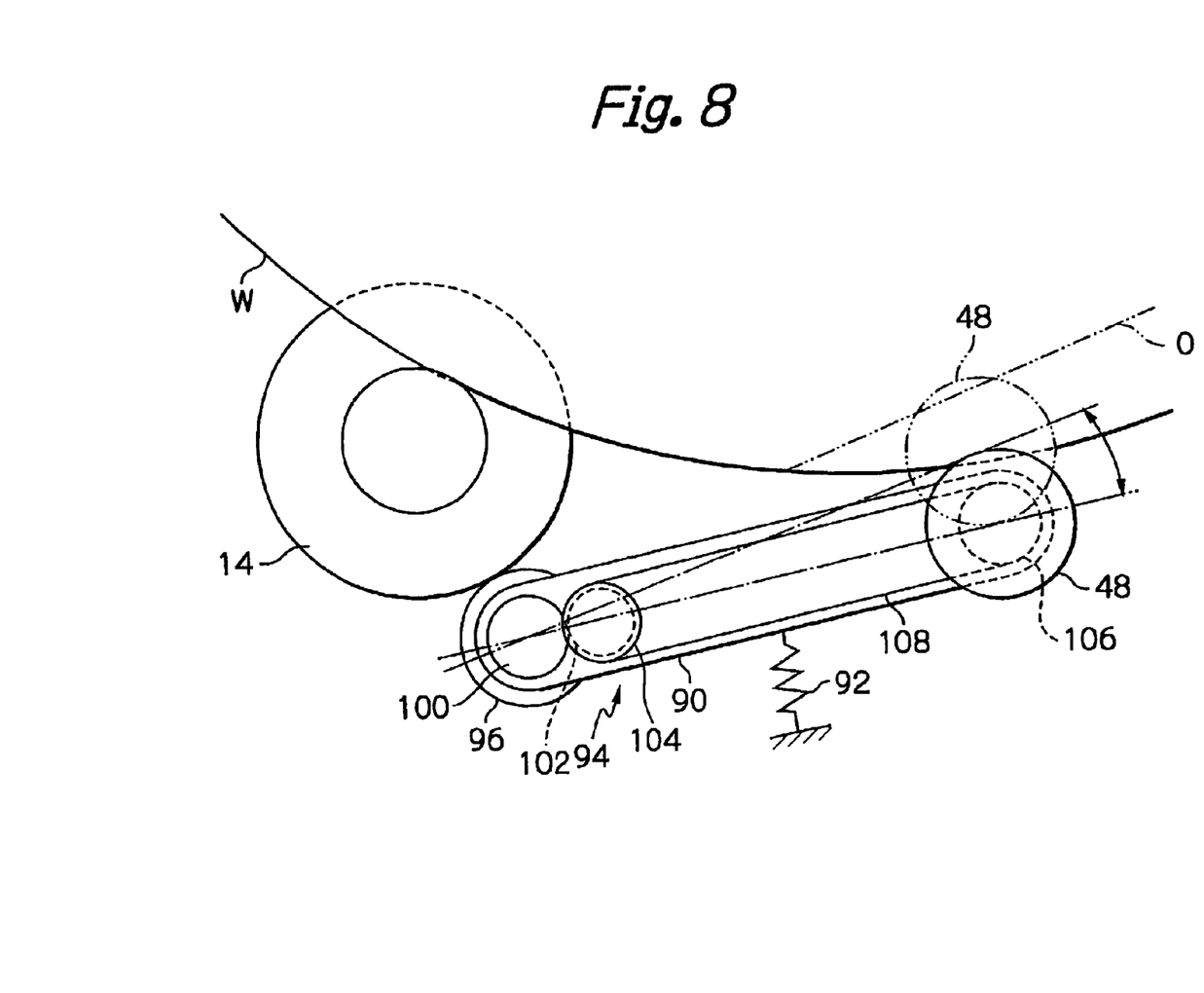
FIG. 8 is a plan view illustrating main components of a substrate cleaning apparatus of the third embodiment according to the present invention.
Figure 9:
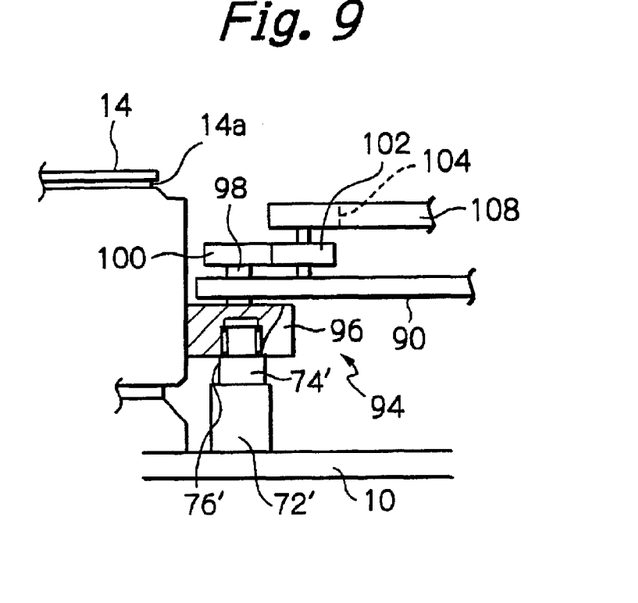
FIG. 9 is a diagram provided for explaining the power transmission mechanism of FIG. 8.

FIGS. 8 and 9 show a substrate cleaning apparatus of the third embodiment of the present invention, in which a swing arm 90 is provided and a cleaning roller 48 is rotatably supported on the free end of the swing arm 90, wherein the swing arm 90 is biased toward the substrate W by a spring 92, and frictional force and a belt are used as the power transmitting mechanism 94.

That is, a rotary component 96 is operatively arranged next to the substrate rotating roller 14 so as to rotate freely, the rotary component 96 coming into compressive contact with the outer peripheral surface of the substrate rotating roller 14 so as to be rotated in association with the revolution of the substrate rotating roller 14, and the base end of the swing arm 90 is fittingly supported with some play by a rotary shaft 98 of the rotary component 96 so as to be prevented from moving up and down, while a cleaning roller 48 is rotatably supported on the free end of the swing arm 90. The swing arm 90 rotatably supports a driven rotating disc 102 which comes into compressive contact with a driving rotating disc 100 rotating together with the rotary component 96 in one unit, so as to rotate as the driving rotating disc 100 rotates, and a timing belt 108 extends between a drive pulley 104 rotating together with the driven rotating disc 102 in one unit and a driven pulley 106 attached to the outer peripheral surface of the cleaning roller 48, so as to couple them, and thereby the power transmission mechanism 94 is configured.

That is, as the substrate rotating roller 14 rotates, the rotary component 96 is rotated, and the revolution of the rotary component 96 is transmitted to the pair of rotating discs 100 and 102 to rotate the driving pulley 104, and then transmitted through the timing belt 108 to the driven pulley 106, which is attached to the cleaning roller 48, and thus, eventually the cleaning roller 48 is rotated. Further, the swing arm 90 is biased by resilient force of the spring 92 toward the substrate W, and the cleaning member 52 attached to the outer peripheral surface thereof (see FIG. 3) is brought into contact with the end face and/or the bevel face of the substrate W.

According to this embodiment, by way of applying an appropriate bias force suitable for the rotation speed of the substrate W to the swing arm 90 by the spring 92, the end face and/or the bevel face of a flat oriented portion O of the substrate W having the flat oriented portion O can also be cleaned.

Then, after the cleaning operation has finished, the rotation of the substrate rotating rollers 12 and 14 is stopped so as to stop the revolution of the substrate W and the cleaning roller 48, and each of the pair of support bases 10, 10 is moved away from the other to release the substrate W from gripped condition, where at the same time the swing arm 90 together with a rotary component transfer base 72', a support rod 74' and a bearing 76' as one integral unit moves outwardly, so that the contact engagement of the cleaning member 52 (see FIG. 3) with the end face and/or the bevel face of the substrate W may be released.

Figure 10:
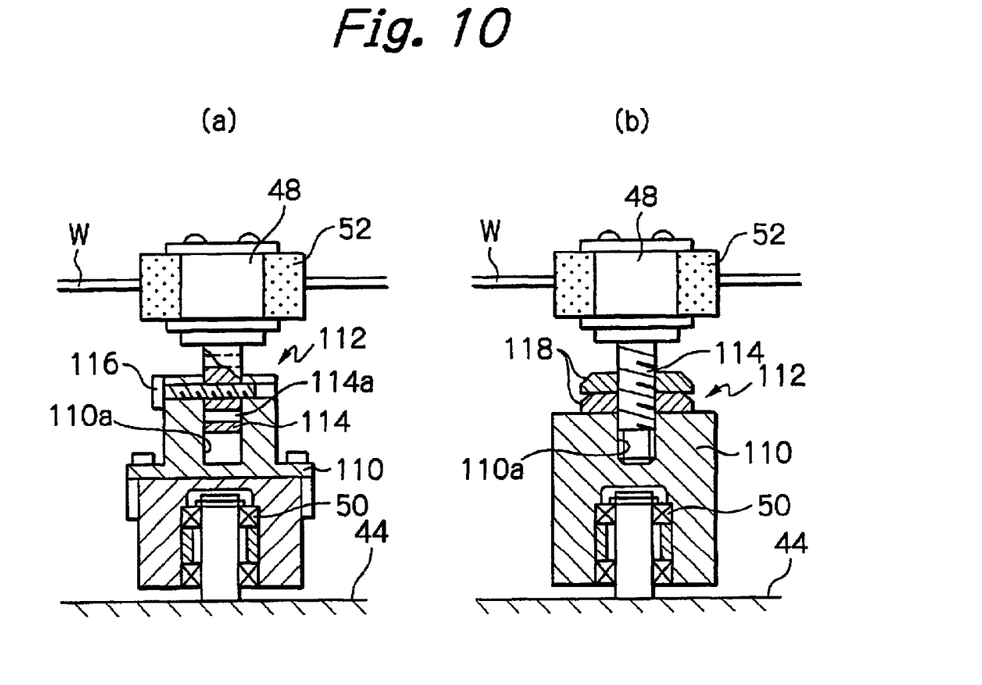

Herein, as shown in FIGS. 10(a) and 10(b), a contact location adjusting mechanism 112 may be arranged between the cleaning roller 48 equipped with the cleaning member 52 in the outer peripheral surface thereof and a cleaning roller supporter 110 for supporting the cleaning roller 48 so that the contact location of the cleaning member 52 with respect to the substrate W may be vertically adjusted.

That is, in a configuration shown in FIG. 10(a), a bar-like portion 114 is provided in a lower portion of the cleaning roller 48, which includes a plurality of through-holes 114a formed therein as penetrated laterally in a specified pitch in the vertical direction of the bar-like portion 114, and the bar-like portion 114 is inserted into a central hole 110a formed in the cleaning roller supporter 110 and a bolt 116 is inserted through the desired through-hole 114a of the bar-like portion 114 so as to be fittingly coupled by thread with the cleaning roller supporter 110, thus making up the contact location adjusting mechanism 112. Further, FIG. 10(b) shows another configuration, in which a male thread is formed on the bar-like portion 114 provided in the lower portion of the cleaning roller 48 and a female thread to be engaged with the male thread is formed in the central hole 110a formed in the cleaning roller supporter 110, respectively, and further a double nut 118 is engaged with the male thread of the bar-like portion 114 provided in the lower portion of the cleaning roller 48, thus making up the contact location adjusting mechanism 112.

Thus, by providing the contact location adjusting mechanism 112 for adjusting the contact location of the cleaning member 52 in the vertical direction thereof with the substrate W and using the cleaning member 52 as displaced vertically depending on the abrasion thereof, the full width of the cleaning member 52 along the vertical direction thereof may be effectively utilized and thus the cleaning member 52 may be used in economical way.

Figure 11:
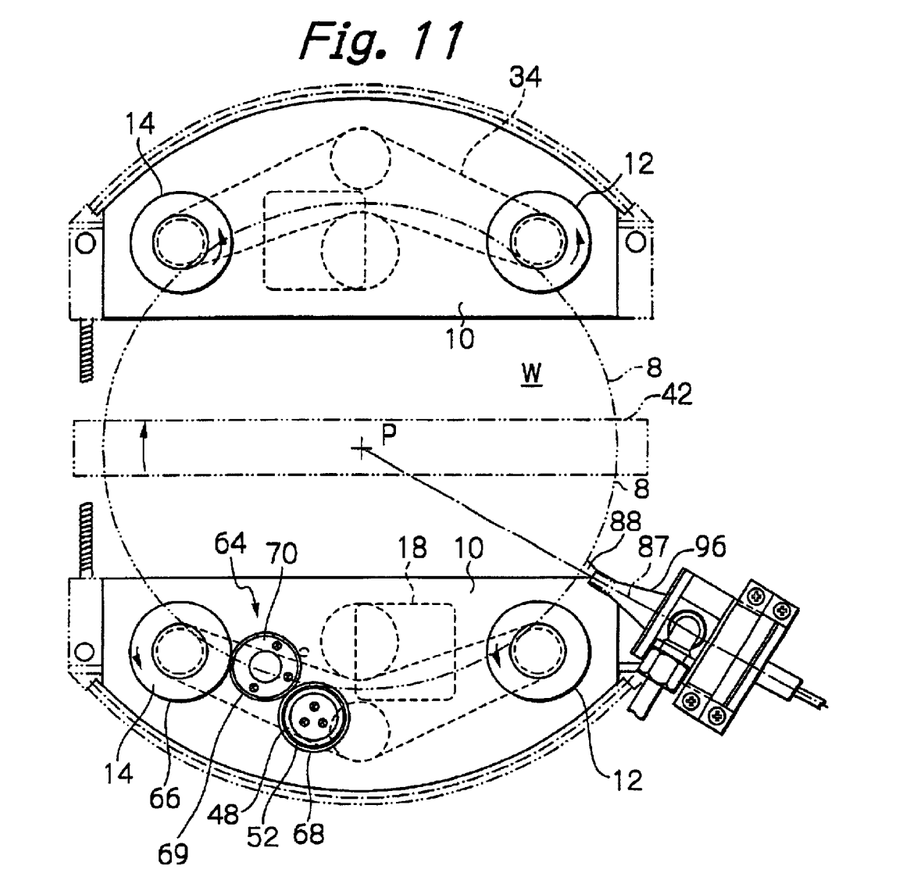
FIG. 11 is a plan view illustrating a substrate cleaning apparatus of the fourth embodiment according to the present invention.
Figure 12:
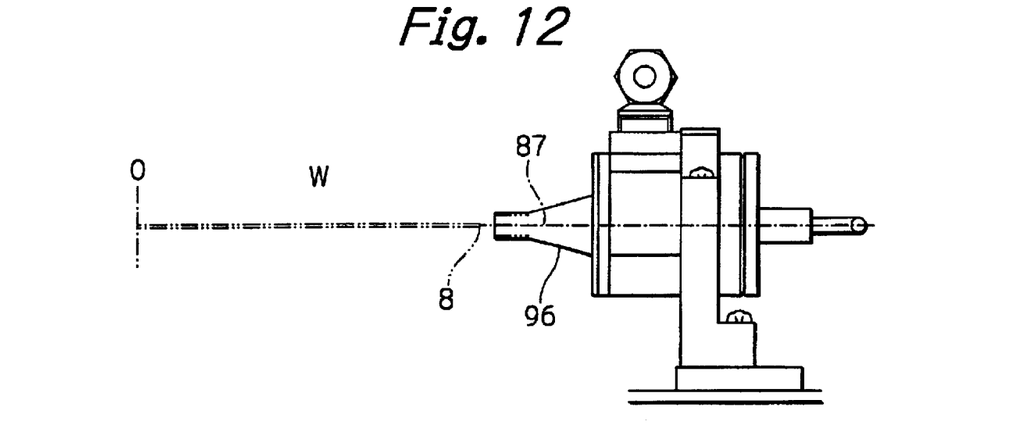
FIG. 12 is a side elevational view illustrating the cleaning liquid nozzle of the substrate cleaning apparatus of FIG. 11.

FIGS. 11 and 12 respectively show a substrate cleaning apparatus 1 and an ultrasonic cleaning liquid nozzle 96 according to the fourth embodiment of the present invention. In the apparatus shown in FIGS. 11 and 12, components corresponding to those in FIGS. 1 to 10 are designated by the same reference numerals, and a duplicated explanation therefor should be omitted. The substrate cleaning apparatus 1 of FIG. 11 performs a scrub cleaning and an ultrasonic cleaning at the same time. In the scrub cleaning, a cleaning member 52 of a cleaning roller 48 is brought into contact with the an end face 8 and/or the bevel face of a substrate W to perform a scrub-cleaning. While in the ultrasonic cleaning, cleaning liquid 88 is injected from the ultrasonic cleaning liquid nozzle 96 so as to impinge upon the end face 8 of the substrate W. As disclosed in JP-A-2001-53047 (Japanese Unexamined Patent Publication), the ultrasonic nozzle 96 is useful in cleaning substrate surfaces having a concave portion. The substrate cleaning apparatus 1 shown in FIG. 11, which performs the ultrasonic cleaning and the scrub cleaning at the same time, allows the substrate to be cleaned thoroughly in a short time.

As shown in FIGS. 11 and 12, the ultrasonic cleaning liquid nozzle 96 is located so that the nozzle center axial line (jet flow axial line) 87 may extend in the direction normal to the end face 8 of the substrate W so as to pass through a center point P, and supplies the cleaning liquid oscillated by ultrasonic waves against both of the top and the bottom surfaces at the same time. The top and the bottom surfaces of the substrate W may be cleaned both by the scrubbing action of the roller brush 42 (see FIGS. 1 and 2) disposed along the center line of the substrate and by the ultrasonic cleaning liquid 88 supplied to the top and the bottom surfaces of the substrate W.

Cleaning of the bevel portion of the substrate may be distinctly improved in cleaning effect by the scrubbing action of the sponge 52 of the cleaning roller 48 and the cleaning action of the ultrasonic cleaning liquid 88. The cleaning liquid supply to the top and the bottom surfaces of the substrate may be performed by two ultrasonic cleaning liquid nozzles N of FIG. 2, each disposed in the top and the bottom surface sides of the substrate W, substituting for the single cleaning liquid nozzle 96 of FIG. 11.

Effect of the Invention

As has been described above, according to the present invention, a cleaning roller that may be rotated as a substrate rotating roller for rotating a substrate is rotated so that the end face and/or the bevel face of the substrate may be cleaned, without a separate driving source being required exclusively for the cleaning roller. Further, by providing a function for cleaning the end face and/or the bevel face independently, the function can be easily added to roller sponge cleaning equipment or the like used conventionally and commonly in the industry, and thereby only a simple remodeling should be carried out to deal with the case where the function is added as a tailored specification or a retrofit, and further the function would not be an obstacle in cleaning the substrate by rotating the substrate at a high speed.

What is claimed is:

1. A substrate cleaning apparatus comprising:
a cleaning roller adapted to rotate and having a cleaning member adapted to be brought into contact with at least one of an end face and a bevel face of a substrate so as to perform scrub-cleaning to the at least one of the end face and the bevel face;
a power transmission mechanism for transmitting a rotating force for rotating the substrate to the cleaning roller so as to rotate the cleaning roller; and
a contact location adjusting mechanism for vertically adjusting a contact location of the cleaning member with the substrate in a height direction of the cleaning member, the height direction being parallel to the rotation axis of the cleaning member,
wherein the power transmission mechanism has a revolution transfer ratio set such that a relative difference in velocity exists between a peripheral velocity of revolution of the cleaning member and a peripheral velocity of revolution of the substrate.

2. A substrate cleaning apparatus of claim 1, further comprising a plurality of substrate rotating rollers for gripping the periphery of the substrate and rotating the substrate.

3. A substrate cleaning apparatus of claim 2, further comprising a cleaning nozzle for injecting a cleaning liquid against a surface of the cleaning member to be brought into contact with the substrate.

4. A substrate cleaning apparatus of claim 2, further comprising a force adjusting mechanism for adjusting an amount of pushing of the cleaning member against the at least one of the end face and the bevel face of the substrate.

5. A substrate cleaning apparatus of claim 2, further comprising a swingable swing arm rotatably supporting the cleaning roller on a free end thereof, wherein the swingable swing arm is biased in a direction of bringing the cleaning member into contact with the at least one of the end face and the bevel face of the substrate.

6. A substrate cleaning apparatus of claim 1, further comprising a cleaning nozzle for injecting a cleaning liquid against a surface of the cleaning member to be brought into contact with the substrate.

7. A substrate cleaning apparatus of claim 6, further comprising a force adjusting mechanism for adjusting an amount of pushing of the cleaning member against the at least one of the end face and the bevel face of the substrate.

8. A substrate cleaning apparatus of claim 6, further comprising a swingable swing arm rotatably supporting the cleaning roller on a free end thereof, wherein the swingable swing arm is biased in a direction of bringing the cleaning member into contact with the at least one of the end face and the bevel face of the substrate.

9. A substrate cleaning apparatus of claim 1, further comprising a force adjusting mechanism for adjusting an amount of pushing of the cleaning member against the at least one of the end face and the bevel face of the substrate.

10. A substrate cleaning apparatus of claim 9, further comprising a swingable swing arm rotatably supporting the cleaning roller on a free end thereof, wherein the swingable swing arm is biased in a direction of bringing the cleaning member into contact with the at least one of the end face and bevel face of the substrate.

11. A substrate cleaning apparatus of claim 1, further comprising a swingable arm rotatably supporting the cleaning roller on a free end thereof, wherein the swingable swing arm is biased in a direction of bringing the cleaning member into contact with the at least one of the end face and the bevel face of the substrate.

12. A substrate cleaning apparatus comprising:
a pair of bases movable to come close to or to go away from each other;
a plurality of rollers supported on the bases, the rollers adapted to grip a periphery of a substrate;
a substrate rotating mechanism operable to rotate the rollers to thereby rotate the substrate;
a scrub-cleaning member supported on the bases, the scrub-cleaning member adapted to clean an end face of the substrate;
a contact location adjusting mechanism for vertically adjusting a contact location of the scrub-cleaning member with the substrate in a height direction of the scrub-cleaning member, the height direction being parallel to the rotation axis of the scrub-cleaning member; and a cleaning nozzle for directing a cleaning liquid between the scrub-cleaning member and the periphery of the substrate.

13. A substrate cleaning apparatus of claim 12, wherein the scrub-cleaning member comprises a cleaning roller which contacts the end face of the substrate.

14. A substrate cleaning apparatus of claim 13, wherein the substrate rotating mechanism transmits a rotating force to the cleaning roller.

15. A substrate cleaning apparatus of claim 12, further comprising a ultrasonic nozzle directing cleaning liquid to the end face of the substrate.

16. A substrate cleaning apparatus of claim 12, wherein each of rollers has a groove into which the periphery of the substrate is to be inserted.

* * * * *